(12) United States Patent
Aochi et al.

(10) Patent No.: US 6,924,523 B2
(45) Date of Patent: Aug. 2, 2005

(54) SEMICONDUCTOR MEMORY DEVICE AND METHOD FOR MANUFACTURING THE DEVICE

(75) Inventors: Hideaki Aochi, Kawasaki (JP); Mitsuru Sato, Yokkaichi (JP); Eiji Yoshida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/391,889

(22) Filed: Mar. 19, 2003

(65) Prior Publication Data

US 2003/0227802 A1 Dec. 11, 2003

(30) Foreign Application Priority Data

Mar. 19, 2002 (JP) ........................................ 2002-076905

(51) Int. Cl.[7] ............................................ H01L 27/108
(52) U.S. Cl. .............................. 257/296; 257/E21.008; 257/E21.293; 438/255; 438/398; 438/665
(58) Field of Search .................. 257/E21.008, E21.293; 438/255, 398, 665

(56) References Cited

U.S. PATENT DOCUMENTS 6,159,849 A * 12/2000 Kang et al. .................. 438/665

FOREIGN PATENT DOCUMENTS

| JP | 9-153596 | 6/1997 |
|---|---|---|
| JP | 11-289062 | 10/1999 |
| JP | 2000-156476 | 6/2000 |
| JP | P2000-156476 | 6/2000 |
| JP | P2002-134719 | 5/2002 |

* cited by examiner

*Primary Examiner*—David Nelms
*Assistant Examiner*—Mai-Huong Tran
(74) *Attorney, Agent, or Firm*—Frommer Lawrence & Haug LLP

(57) ABSTRACT

A semiconductor memory device includes a semiconductor substrate and a support layer provided above the semiconductor substrate. Particles are formed on the support layer. A first electrode is provided on the support layer such that it covers the particles. The first electrode has a first interface located opposite to the particles and being wavy in accordance with the pattern of the particles. A capacitor insulation film is provided on the first interface. The capacitor insulation film has a second interface located opposite to the first interface and being wavy in accordance with the shape of the first interface. A second electrode is provided on the capacitor insulation film.

12 Claims, 10 Drawing Sheets

SEMICONDUCTOR MEMORY DEVICE AND METHOD FOR MANUFACTURING THE DEVICE

CROSS-REFERENCE TO RELATED APPLICATIONS

This application is based upon and claims the benefit of priority from the prior Japanese Patent Application No. 2002-076905, filed Mar. 19, 2002, the entire contents of which are incorporated herein by reference.

BACKGROUND OF THE INVENTION

1. Field of the Invention

The present invention relates to a semiconductor memory device and method for manufacturing the device, and more particularly to the structure of a capacitor in a memory cell employed in a semiconductor memory device.

2. Description of the Related Art

Recently, microfabrication techniques for semiconductor memory devices, in particular, dynamic random access memories (DRAMs), have been developed remarkably. In accordance with this tendency, the area occupied by memory cells in semiconductor memory devices has been increasingly reduced. On the other hand, in accordance with a reduction in the voltage applied to a semiconductor memory device, it is necessary to increase the capacitance of a capacitor incorporated in a memory cell in order to operate a DRAM without errors. Thus, how to secure a sufficient capacitance in the capacitor of a memory cell is an important issue.

In general, to increase the capacitance of a capacitor, reducing the thickness of a capacitor insulation film, or increasing the areas of the upper and lower electrodes of the capacitor are possible. However, in light of, for example, reliability, there is a limit to reducing the thickness of the capacitor insulation film. Further, increasing the surface area of each capacitor electrode conflicts with reducing the size of a semiconductor memory device.

To solve these problems, roughening of the surface of the capacitor electrode is now being executed. By making the surface of the capacitor electrode wavy, the surface area is increased. This leads to an increase in the capacitance of the capacitor.

The semiconductor memory device shown in FIG. 19 comprises a capacitor section 101 and MOS metal oxide semiconductor (MOS) transistor section 102. The capacitor section 101 is formed of a lower electrode 103, capacitor insulation film 104 and upper electrode 105. The lower electrode 103 and upper electrode 105 are formed of polysilicon. Reference numeral 106 denotes silicon particles. Part of each particle 106 is embedded in the lower electrode 103. The capacitor insulation film 104 contains the particles 106, and therefore swells at the positions of the particles 106. As a result, the surface of the capacitor insulation film 104 is made wavy or roughened. The surface of the upper electrode 105 is accordingly made wavy.

FIGS. 20–22 show a method for manufacturing the above-described capacitor structure. As seen from FIG. 20, the MOS transistor section 102, interlayer insulation film 108, contact plug, etc., are formed on a semiconductor substrate 107. Subsequently, the lower electrode 103 is formed on the interlayer insulation film 108. After that, a material insulation film 106a of polysilicon is formed on the lower electrode 103 at 500–550° C.

Subsequently, the resultant semiconductor substrate 107 is subjected to a heat treatment of about 600–700° C. As a result of this heat treatment, part of the material insulation film 106a and lower electrode 103 is agglutinated into a plurality of particles 106 as shown in FIG. 21.

After that, the capacitor insulation film 104 is formed on the lower electrode 103, covering the particles 106, as shown in FIG. 21. Thereafter, the upper electrode 105 is formed on the capacitor insulation film 104 as shown in FIG. 19.

To prevent a depletion portion from being formed in a pn-junction when a voltage is applied to a semiconductor memory device having a capacitor, the upper and lower electrodes of the capacitor must contain a sufficient amount of impurity (e.g., As or P). To this end, after the upper and lower electrodes are formed, an impurity is implanted into them. However, it is difficult to deposit the capacitor electrode on the particles 106 while a sufficient amount of impurity is being implanted into the electrode. Therefore, after the capacitor electrodes have been formed, heat treatment is necessary to diffuse the impurity. In the case of a stack-type DRAM in which a capacitor structure is formed after the formation of a transistor structure, the heat treatment degrades the characteristics of the transistor.

Furthermore, attempts are now being made to increase the capacitance of a capacitor using a capacitor insulation film of a high dielectric material, such as a tantalum oxide film ($Ta_2O_5$), which has a higher dielectric constant than a silicon oxide film. If a high dielectric material is used for a capacitor insulation film, it is known from research that it is desirable to use a metal of the platinum family, such as ruthenium, as the material of the capacitor electrode.

However, with the conventional capacitor electrode surface roughening techniques, only the surface of the layer covering the particles formed on polysilicon can be roughened. In other words, the conventional roughening techniques can be used only when the lower electrode is formed of polysilicon. If the layer in which particles are embedded, i.e., the lower electrode, is formed of a material other than polysilicon, the conventional techniques cannot be applied, since appropriate conditions that include an appropriate treatment temperature have not yet been found.

BRIEF SUMMARY OF THE INVENTION

According to a first aspect of the invention, there is provided a semiconductor memory device having a capacitor structure, comprising: a semiconductor substrate; a support layer provided above the semiconductor substrate; a plurality of particles formed on the support layer; a first electrode provided on the support layer and covering the particles, the first electrode having a first interface located remote from the particles and made wavy in accordance with a pattern of the particles; a capacitor insulation film provided on the first interface, the capacitor insulation film having a second interface located remote from the first interface and made wavy in accordance with a shape of the first interface; and a second electrode provided on the capacitor insulation film.

According to a second aspect of the invention, there is provided a method of manufacturing a semiconductor memory device having a capacitor structure, comprising: forming a first support layer above a semiconductor substrate; depositing a material insulation film on the first support layer, the material insulation film being substantially formed of a material selected from the group consisting of silicon and silicon nitride; cooling the material insulation film to make it collect into particles; forming a conductive film on the first support layer such that the conductive film covers the particles, thereby providing a first electrode having a first interface located remote from the particles and made wavy in accordance with a pattern of the particles; forming a capacitor insulation film on the first interface, the capacitor insulation film having a second interface located remote from the first interface and made wavy in accordance with a shape of the first boundary; and forming a second electrode on the capacitor insulation film.

According to a third aspect of the invention, there is provided a method of manufacturing a semiconductor memory device having a capacitor structure, comprising: forming a first support layer above a semiconductor substrate; forming a second support layer on the first support layer; removing part of the second support layer, thereby forming a trench, the trench reaching the first support layer; depositing a material insulation film on an inner surface of the trench, the material insulation film being substantially formed of a material selected from the group consisting of silicon and silicon nitride; cooling the material insulation film to make it collect into particles; forming a conductive film on the inner surface of the trench such that the conductive film covers the particles, then removing the second support layer and the particles, thereby providing a first cylindrical electrode having a bottom, a side wall and a first interface, the first interface being located remote from the particles and made wavy in accordance with a pattern of the particles; forming a capacitor insulation film on the first interface, the capacitor insulation film having a second interface located remote from the first interface and made wavy in accordance with a shape of the first boundary; and forming a second electrode on the second interface.

DETAILED DESCRIPTION OF THE INVENTION

Figure 1:
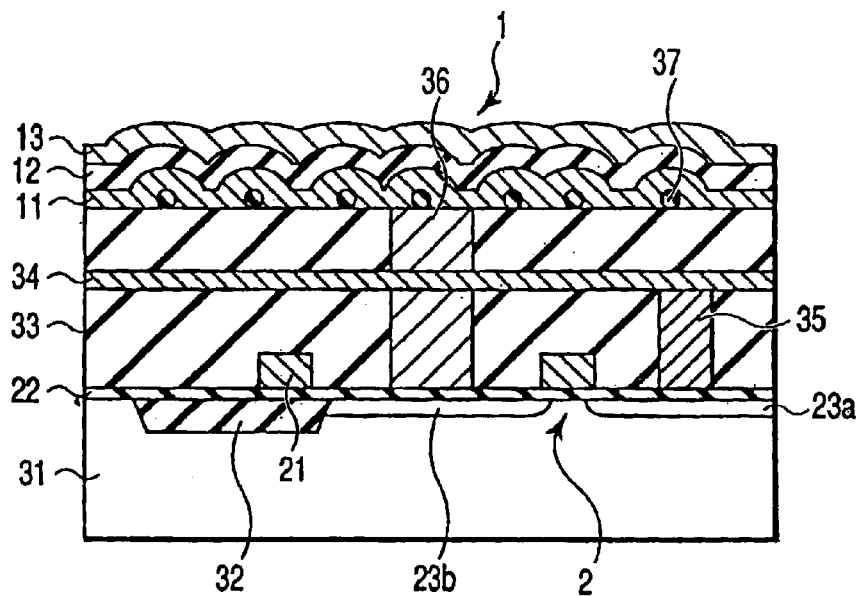
FIG. 1 is a schematic sectional view illustrating a semiconductor memory device according to a first embodiment of the invention.

Embodiments of the invention will be described with reference to the accompanying drawings. In the drawings, like reference numerals denote like elements, and a duplicate explanation will be given only when necessary.

(First Embodiment)

FIG. 1 schematically illustrates a semiconductor memory device according to a first embodiment of the invention. The semiconductor memory device of the first embodiment has a stack-type capacitor. As seen from FIG. 1, the semiconductor memory device comprises a capacitor section 1 and MOS transistor section 2. The capacitor section 1 is formed of a lower electrode 11 (first electrode), capacitor insulation film 12, and upper electrode 13 (second electrode), and serves as a cell capacitor. The MOS transistor section 2 is formed of a gate electrode 21, gate insulation film 22 and source/drain diffusion layers 23a and 23b, and serves as a cell transistor.

An element isolation region 32 formed of an insulation film is provided in the surface of a semiconductor substrate 31. The element isolation region 32 isolates the element region of the semiconductor memory device. The source/drain diffusion layers 23a and 23b are formed in the surface of the semiconductor substrate 31 within the element region. The semiconductor substrate 31 is coated with the gate insulation film 22. The gate electrode 21 is provided on the gate insulation film 22 between the source/drain diffusion layers 23a and 23b. The gate electrode 21 may be formed of, for example, polysilicon, or may have a double-layer structure of polysilicon and tungsten.

An interlayer insulation film 33 (support layer), for example, is formed on the semiconductor substrate 31. A bit line 34 is formed in the interlayer insulation film 33 so that it extends in the width direction of the drawing. The bit line 34 is electrically connected to the source/drain diffusion layer 23a by a contact plug 35. The contact plug 35 extends through the gate insulation film 22 to the source/drain diffusion layer 23a.

A contact plug 36 (conductive layer) is formed in the interlayer insulation film 33 so that it extends through the gate insulation film 22 to the source/drain diffusion layer 23b.

A plurality of particles 37 are provided on the interlayer insulation film 33 and contact plug 36. The particles 37 have a diameter of, for example, 2.5–7.5 nm, preferably, 5 nm. The lower electrode 11 is formed on the interlayer insulation film 33 and contact plug 36 to cover the particles 37. The surface (first interface) of the lower electrode 11 swells at the positions of the particles 37, and is therefore made wavy or roughened in accordance with the pattern of the particles 37. The lower electrode 11 has a thickness greater than the diameter (curvature radius) of the particles 37. The lower electrode 11 is formed of a semiconductor material such as silicon, titanium nitride or ruthenium, etc or a metal of the platinum family. The lower electrode 11 is connected to the contact plug 36, and is electrically connected, via the contact plug 36, to the source/drain diffusion layer 23b.

The capacitor insulation film 12 is formed on the lower electrode 11. The surface (second interface) of the capacitor insulation film 12 is also made wavy in accordance with the wavy surface of the lower electrode 11. The capacitor insulation film 12 is formed of a high dielectric material such as NO, $Ta_2O_5$ or BSTO, etc. The upper electrode 13 is formed on the capacitor insulation film 12. The surface (third interface) of the upper electrode 13 is made wavy in accordance with the wavy surface of the capacitor insulation film 12, and is formed of, for example, the same material as the lower electrode 11.

Figure 2:
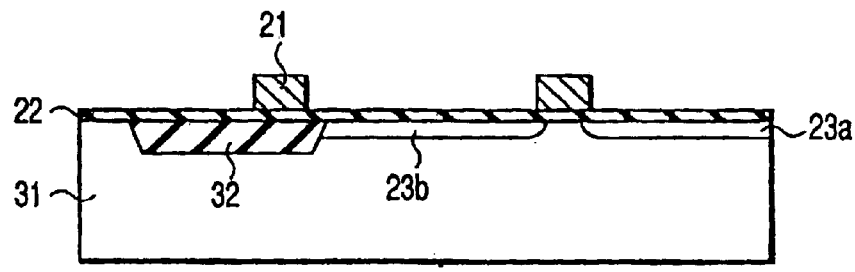
FIGS. 2, 3, 4 and 5 are schematic sectional views illustrating a process for manufacturing the semiconductor memory device shown in FIG. 1.

FIGS. 2–5 schematically illustrate the process of manufacturing the semiconductor memory device constructed as above. Referring to these figures, the semiconductor memory device manufacturing process will be described. Firstly, as shown in FIG. 2, the element isolation region 32 is formed in the surface of the semiconductor substrate 31, using, for example, the STI (Shallow Trench Isolation) technique.

Subsequently, a MOS transistor is formed using a known technique. Specifically, a silicon oxide film, serving as a gate insulation film 22, is formed on the semiconductor substrate 31 by, for example, thermal oxidation. After that, a polysilicon film is deposited on the gate insulation film 22 and is patterned into the gate electrode 21. Thereafter, impurities are implanted into selected portions of the semiconductor substrate 31 by ion implantation, thereby forming impurity diffusion layers that serve as source/drain diffusion layers 23a and 23b.

Figure 3:
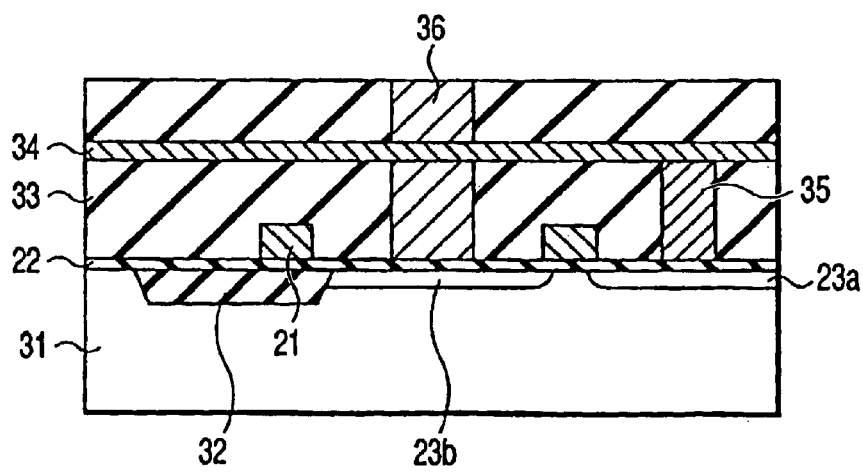

Subsequently, as shown in FIG. 3, the interlayer insulation film 33 is formed by, for example, CVD on the semiconductor such that it covers the gate electrode 21. Then, the bit line 34 is formed in the interlayer insulation film 33 by a known technique. After that, the contact plug 35 that connects the bit line 34 to the source/drain diffusion layer 23a is formed. After that, the contact plug 35 that connects the bit line 34 to the source/drain diffusion layer 23b is formed through the interlayer insulation film 33.

Figure 4:
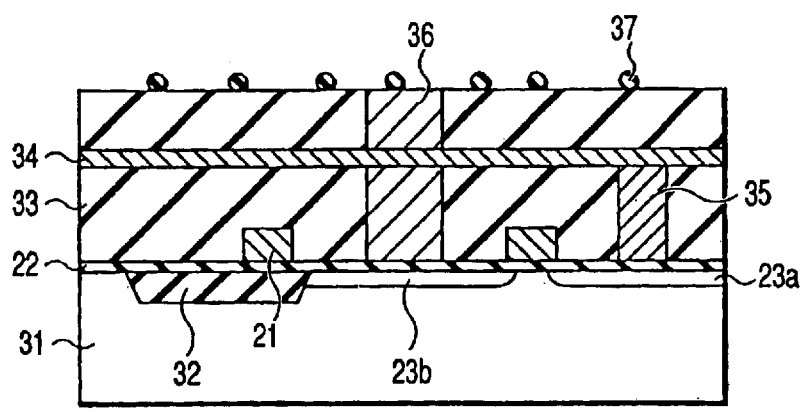

Referring to FIG. 4, a material insulation film formed of, for example, silicon or silicon nitride is deposited on the interlayer insulation film 33 by, for example, LPCVD (Low Pressure Chemical Vapor Deposition). Thereafter, the resultant semiconductor memory device is cooled to a room temperature. As a result, the material insulation film collects into particles 37 on the interlayer insulation film 33. The thickness of the material insulation film is, for example, 2.5–7.5 nm, and preferably, 5 nm.

Figure 5:
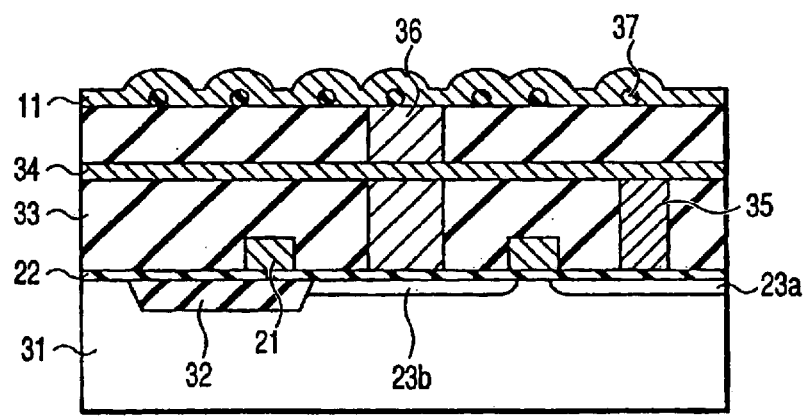

Referring to FIG. 5, the lower electrode 11 is formed by, for example, LPCVD on the entire surface of the resultant semiconductor substrate 31, such that it covers the particles 37. Subsequently, the capacitor insulation film 12 and upper electrode 13 are formed in this order on the lower electrode 11, using, for example, LPCVD, as shown in FIG. 1. After that, an interlayer insulation film (not shown) is formed by a known technique on the entire surface of the resultant semiconductor substrate 31, and wiring and a contact plug (which are not shown), etc. are formed in this interlayer insulation film.

In the above-described first embodiment, a material insulation film of a predetermined thickness is formed on the interlayer insulation film 33 and contact plug 36, and is cooled and hence collects into particles 37. The lower electrode 11, capacitor insulation film 12 and upper electrode 13 are sequentially formed on the entire surface of the resultant semiconductor substrate 31 to cover the particles 37. Since the lower electrode 11 contains the particles 37, its surface is made wavy and roughened. The capacitor insulation film 12 and upper electrode 13 provided on the wavy lower electrode 11 are accordingly made wavy and roughened. Thus, the surface of the lower electrode 11 can be easily roughened regardless of the material of its underlayer. The surface of the upper electrode 13 is also roughed, thereby enabling a small-area capacitor to have a large capacitance.

(Second Embodiment)

Figure 6:
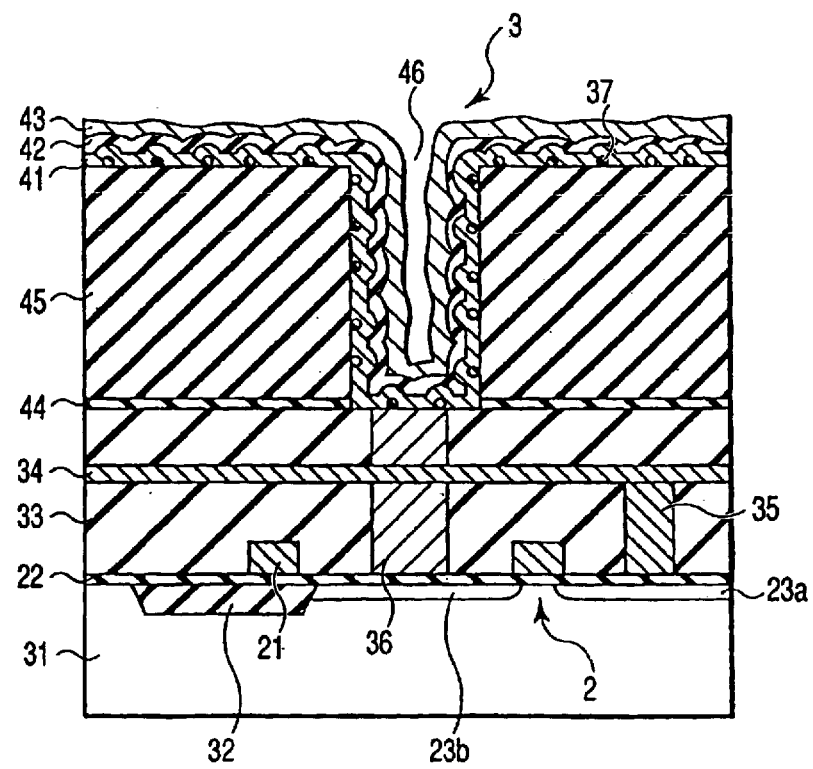
FIG. 6 is a schematic sectional view illustrating a semiconductor memory device according to a second embodiment of the invention.

In a second embodiment, the invention is applied to a concave-type capacitor. FIG. 6 schematically shows the second embodiment. As seen from FIG. 6, a semiconductor memory device according to the second embodiment has a capacitor section 3 and MOS transistor section 2. The capacitor section 3 is formed of a lower electrode 41, capacitor insulation film 42, and upper electrode 43, and serves as a cell capacitor. The second embodiment has the same structure as the first embodiment, from the semiconductor substrate 31 to the interlayer insulation film 33.

An interlayer insulation film (support layer) formed of a silicon nitride film 44 and silicon oxide film 45 is formed on the interlayer insulation film 33. A trench 46 is formed through the silicon nitride film 44 and silicon oxide film 45 such that it extends to the interlayer insulation film 33. The side wall of the trench 46 is substantially perpendicular to the surface of the semiconductor substrate 31. A contact plug 36 is formed such that it extends through the interlayer insulation film 33 and gate insulation film 22 to the source/drain diffusion layer 23b. A plurality of particles 37 are formed on the bottom and side wall of the trench 46, and the upper surface of the silicon oxide film 45.

The lower electrode 41 is formed on the inner surface of the trench 46 and on the silicon oxide film 45, covering the particles 37. The lower electrode 41 is formed of, for example, silicon, ruthenium or titanium nitride, etc. The portions of the lower electrode 41 that cover the particles 37 swell, therefore the lower electrode 41 is made wavy in accordance with the pattern of the particles 37. The lower electrode 41 is electrically connected to the contact plug 36. The capacitor insulation film 42 and upper electrode 43 are formed on the lower electrode 41. Therefore, as in the first embodiment, the capacitor insulation film 42 and upper electrode 43 are made wavy in accordance with the wavy surface of the lower electrode 41.

Figure 7:
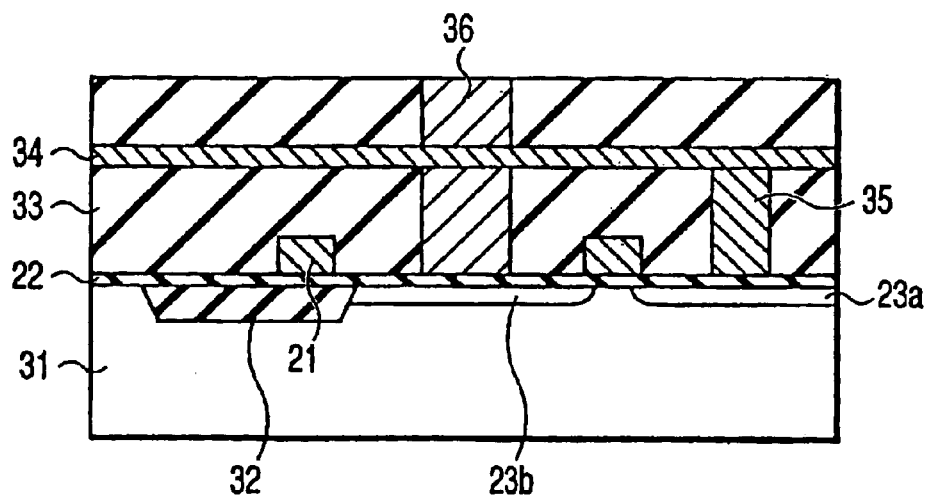
FIGS. 7, 8, 9 and 10 are schematic sectional views illustrating a process for manufacturing the semiconductor memory device shown in FIG. 6.

FIGS. 7–10 are schematic views sequentially illustrating the process of manufacturing the semiconductor memory device constructed as above. As shown in FIG. 7, the element isolation region 32, gate insulation film 22, gate electrode 21, source/drain diffusion layers 23a and 23b are formed in and on the surface of the semiconductor substrate 31, by the same process as employed in the first embodiment. After that, the interlayer insulation film 33 is formed on the entire surface of the semiconductor substrate 31, then the bit line 34 and contact plugs 35 and 36 are formed.

Figure 8:
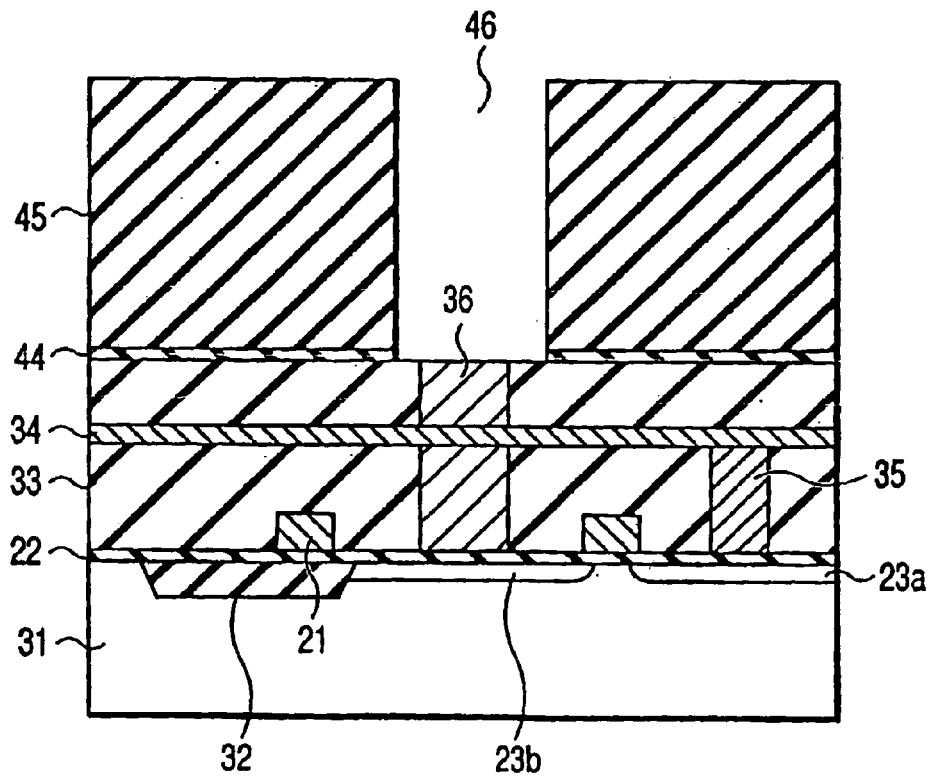

Subsequently, as seen from FIG. 8, the silicon nitride film 44 and silicon oxide film 45 are sequentially formed on the entire surface of the interlayer insulation film 33 by, for example, LPCVD. Then, respective parts of the silicon nitride film 44 and silicon oxide film 45 that are located in a capacitor-forming area are removed by anisotropic etching such as lithography or RIE (Reactive Ion Etching). As a result, the trench 46 is formed. At this time, the upper surface of the contact plug 36 is exposed as the bottom of the trench 46.

Figure 9:
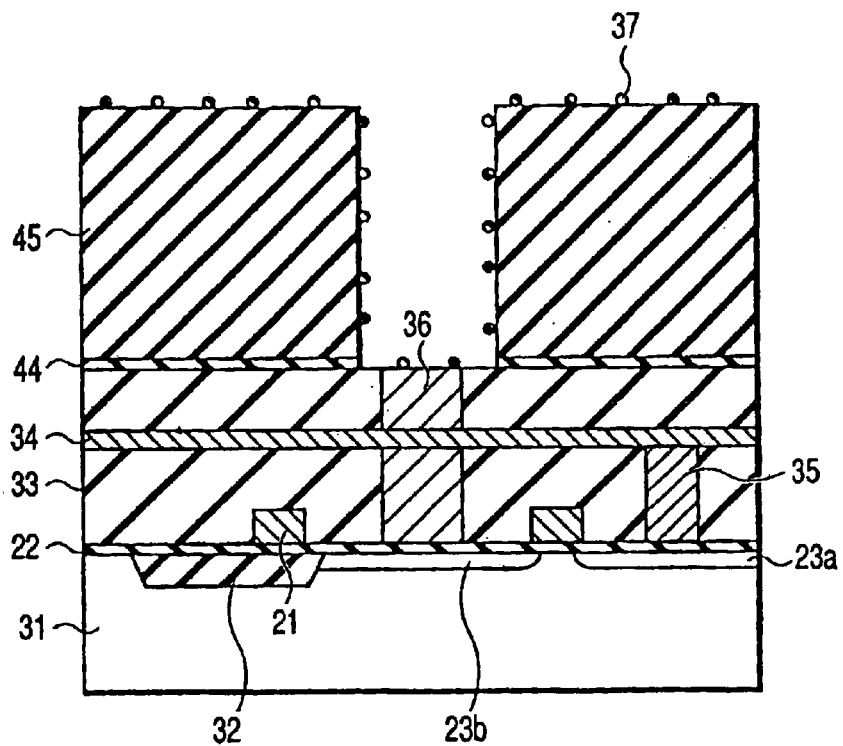

Thereafter, as seen from FIG. 9, a plurality of particles 37 are formed on the inner surface of the trench 46 and on the silicon oxide film 45 by the same process as employed in the first embodiment. More specifically, a material insulation film 37a (not shown) is formed on the inner surface of the trench 46 and on the silicon oxide film 45. The material insulation film 37a is cooled and hence collects into particles 37.

Figure 10:
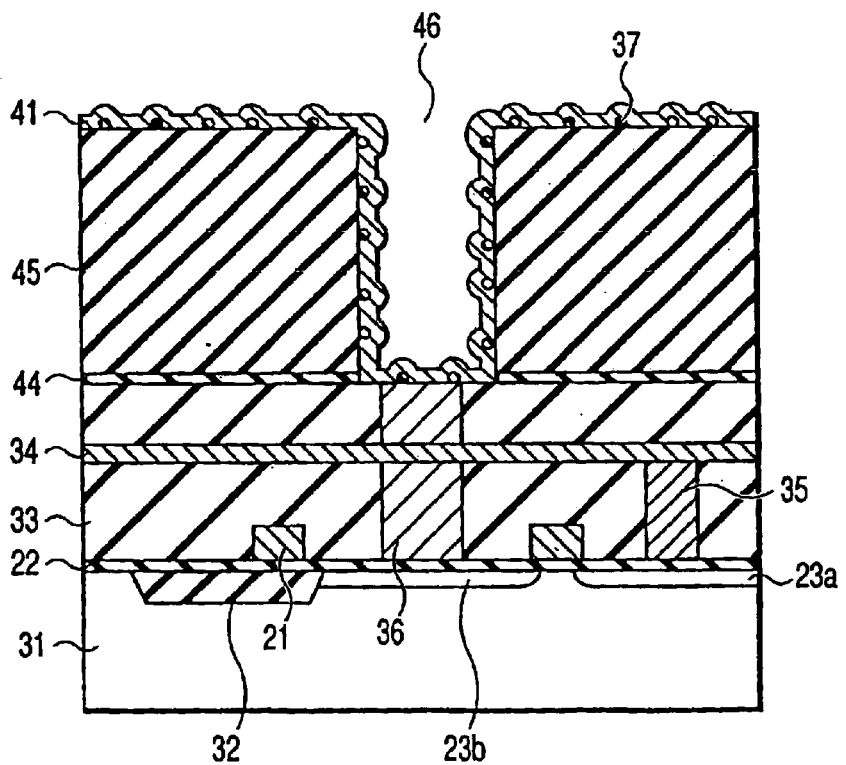

Referring to FIG. 10, the lower electrode 41 is formed by, for example, LPCVD on the bottom and the side wall of the trench 46 and on the silicon oxide film 45, such that it covers the particles 37.

Subsequently, the capacitor insulation film 42 and upper electrode 43 are sequentially formed on the lower electrode 41, using, for example, LPCVD, as shown in FIG. 6. After that, an interlayer insulation film (not shown) is formed by a known technique on the entire surface of the resultant semiconductor substrate 31, and wiring and a contact plug (which are not shown), etc. are formed in this interlayer insulation film.

The above-described second embodiment can provide the same advantage as that obtained by the first embodiment. Furthermore, in the second embodiment in which the invention is applied to a concave-type cell capacitor, the resultant capacitor can have a larger capacitance within a limited area than that obtained in the first embodiment.

(Third Embodiment)

In a third embodiment, the invention is applied to a so-called cylinder-structure capacitor. The cylinder-structure capacitor is a type of stack-type capacitor. This capacitor is a three-dimensional cylindrical capacitor that can have a large surface area while suppressing its occupation area. Further, stack-type capacitors having a double-sided-cylinder structure enable the bottom and inner and outer surfaces of the cylinder to be used as electrode surfaces. As a result, these capacitors can have a large capacitance. The third embodiment employs a stack-type capacitor having a double-sided-cylinder structure.

Figure 11:
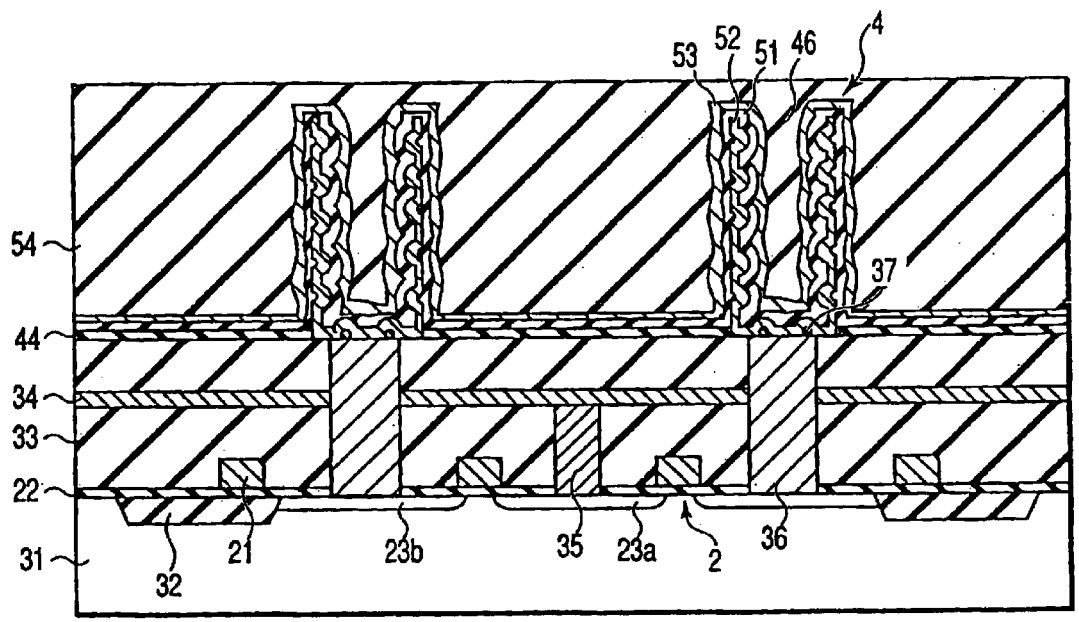
FIG. 11 is a schematic sectional view illustrating a semiconductor memory device according to a third embodiment of the invention.

FIG. 11 schematically shows a semiconductor memory device according to the third embodiment. As seen from FIG. 11, the semiconductor memory device of the third embodiment has a capacitor section 4 and MOS transistor section 2, as in the first and second embodiments. The capacitor section 4 has a stacked structure of a double-sided-cylinder type, and is formed of a lower electrode 51, capacitor insulation film 52 and upper electrode 53. In FIG. 11, the structure ranging from the semiconductor substrate 31 to the silicon nitride film 44 is the same as that of the second embodiment.

A cylindrical trench 46 is formed on the contact plug 36 such that the bottom of the trench is formed of the upper surface of the plug. A plurality of particles 37 are formed on the bottom of the trench 46. The lower electrode 51, which is cylindrical, is formed on the inner surfaces of the trench 46. The lower electrode 51 is formed of silicon, titanium nitride or ruthenium, etc. as in the first and second embodiments. The side wall of the lower electrode 51 has a shape according to the pattern of particles similar to the particles 37, i.e., the side wall is made wavy. The bottom of the lower electrode 51 covers the particles 37. The lower electrode 51 is electrically connected to the contact plug 36.

The capacitor insulation film 52 and upper electrode 53 are sequentially provided on the entire side surface of the lower electrode 51 and on the silicon nitride film 44. Thus, the capacitor insulation film 52 and upper electrode 53 are cylindrical like the lower electrode 51. Further, since the lower electrode 51 as the underlayer of the capacitor insulation film 52 and upper electrode 53 is made wavy, the double sides of each of the capacitor insulation film 52 and upper electrode 53 are accordingly made wavy. The upper electrode 53 of this capacitor is also used as the upper electrodes of adjacent capacitors. An interlayer insulation film 54 is formed on the entire surface of the resultant semiconductor substrate 31.

Figure 12:
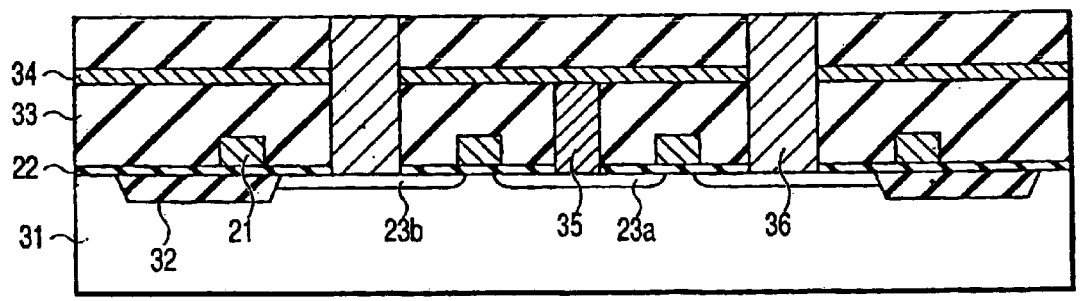
FIGS. 12, 13, 14, 15, 16, 17 and 18 are schematic sectional views illustrating a process for manufacturing the semiconductor memory device shown in FIG. 11.

FIGS. 12–18 are schematic views sequentially illustrating the process of manufacturing the semiconductor memory device constructed as above. As shown in FIG. 12, the element isolation region 32, gate insulation film 22, gate electrode 21, source/drain diffusion layers 23a and 23b are formed in and on the surface of the semiconductor substrate 31, by the same process as employed in the first embodiment. After that, the interlayer insulation film 33 is formed on the entire surface of the semiconductor substrate 31, then the bit line 34 and contact plugs 35 and 36 are formed.

Figure 13:
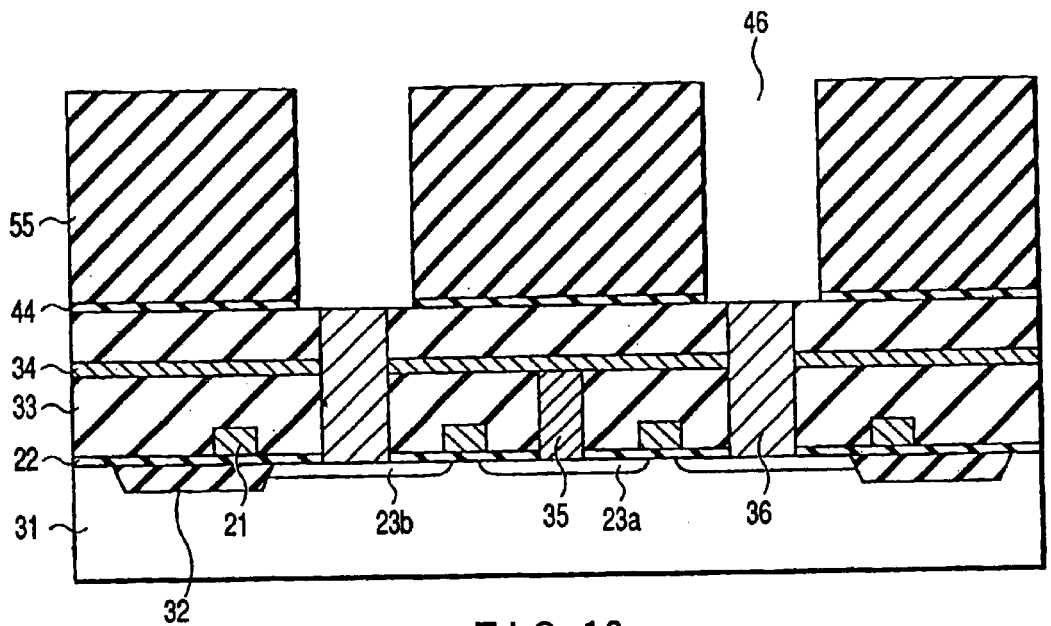

Subsequently, as seen from FIG. 13, the silicon nitride film 44 and silicon oxide film 45 are sequentially formed on the entire surface of the interlayer insulation film 33 by the same process as that employed in the second embodiment. Thereafter, respective parts of the silicon nitride film 44 and silicon oxide film 55 that are located in a capacitor-forming area are removed. As a result, the trench 46 is formed.

Figure 14:
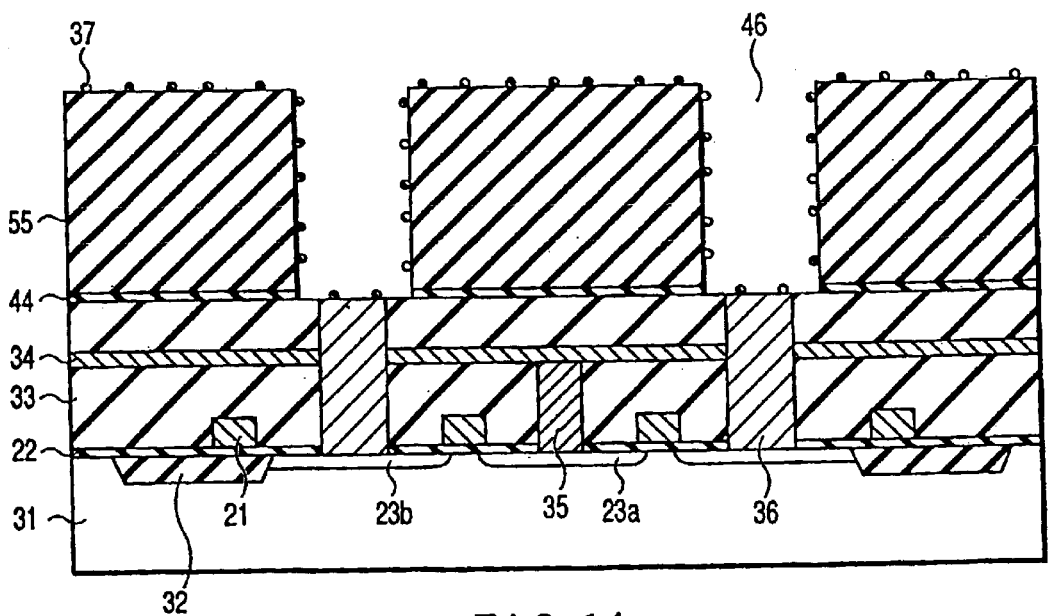

Thereafter, as seen from FIG. 14, a plurality of particles 37 are formed on the inner surface of the trench 46 and on the silicon oxide film 45 by the same process as employed in the second embodiment.

Figure 15:
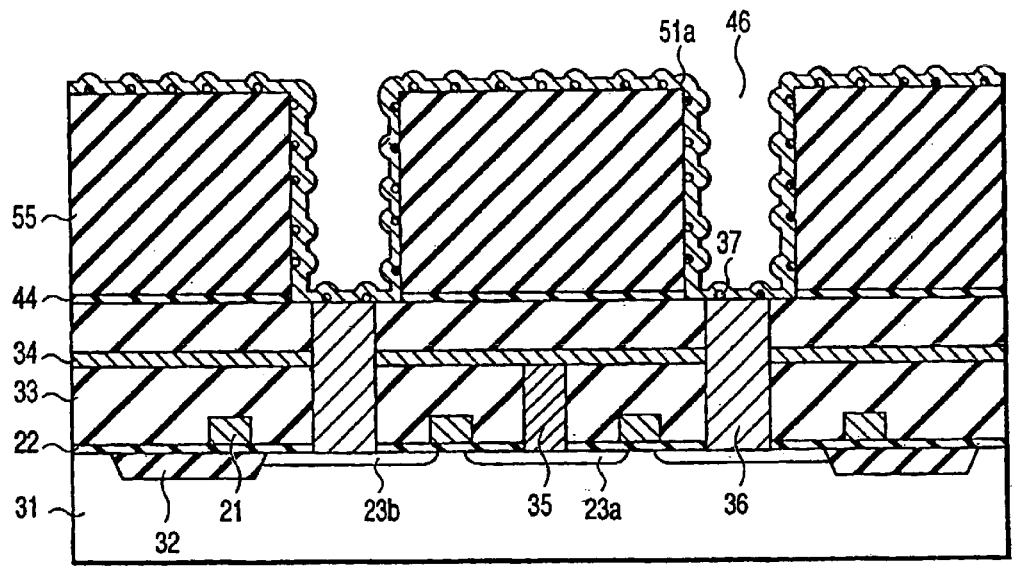

Referring to FIG. 15, a lower electrode material 51a is formed on the bottom and side surface of the trench 46 and on the silicon oxide film 55, such that it covers the particles 37.

Figure 16:
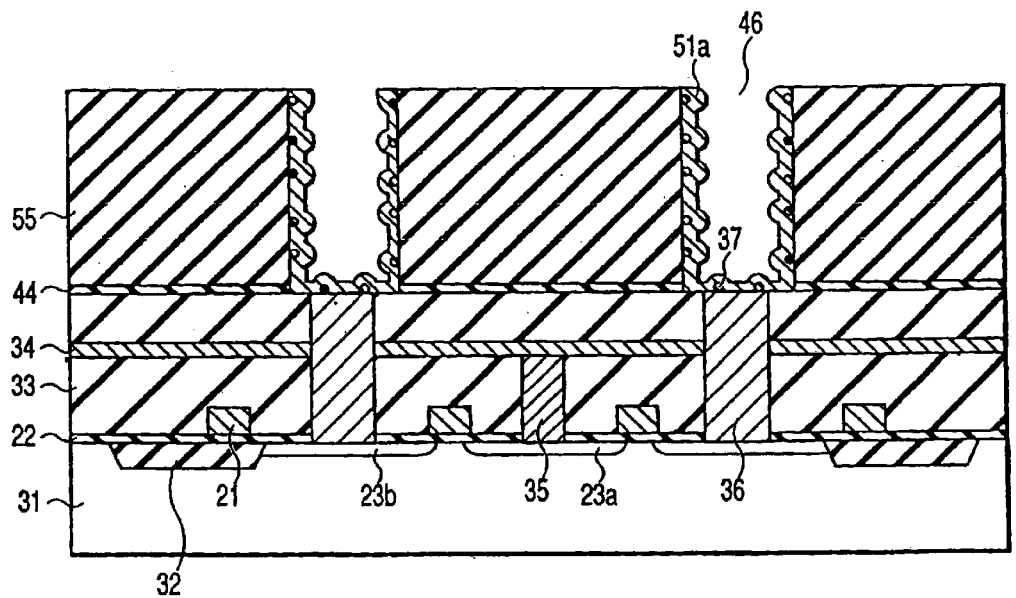

Referring to FIG. 16, the lower electrode material 51a and particles 37 on the upper surface of the silicon oxide film 55 are removed by, for example, CMP (Chemical Mechanical Polishing). At this time, to protect the lower electrode 51a, it is desirable to fill the trench 46 with, for example, a resist. After CMP, the resist is removed by, for example, ashing.

Figure 17:
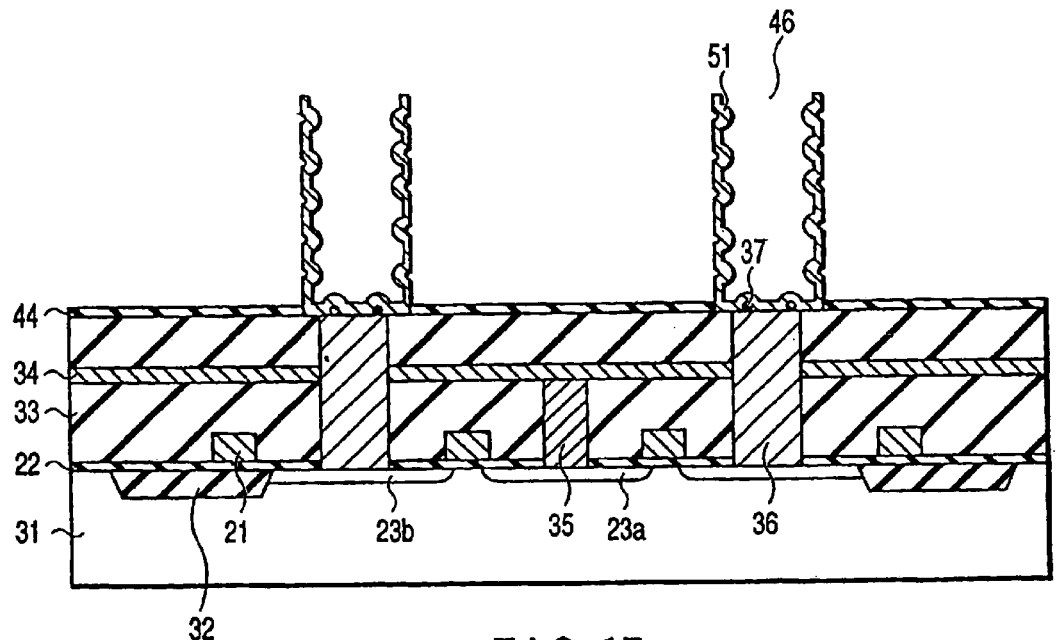

Referring to FIG. 17, the silicon oxide film 55 is removed by, for example, wet etching. Thereafter, the particles in the side wall of the lower electrode material 51a are removed by, for example, wet etching. Thus, the lower electrode 41 of a double-sided-cylinder-type cell capacitor is completed.

Figure 18:
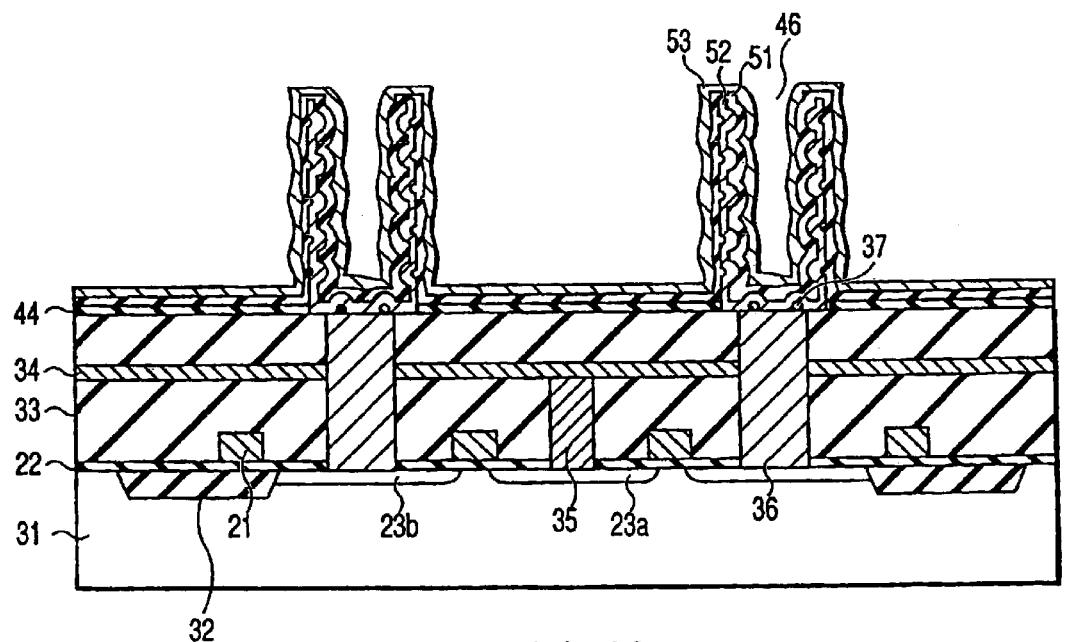
Figure 19:
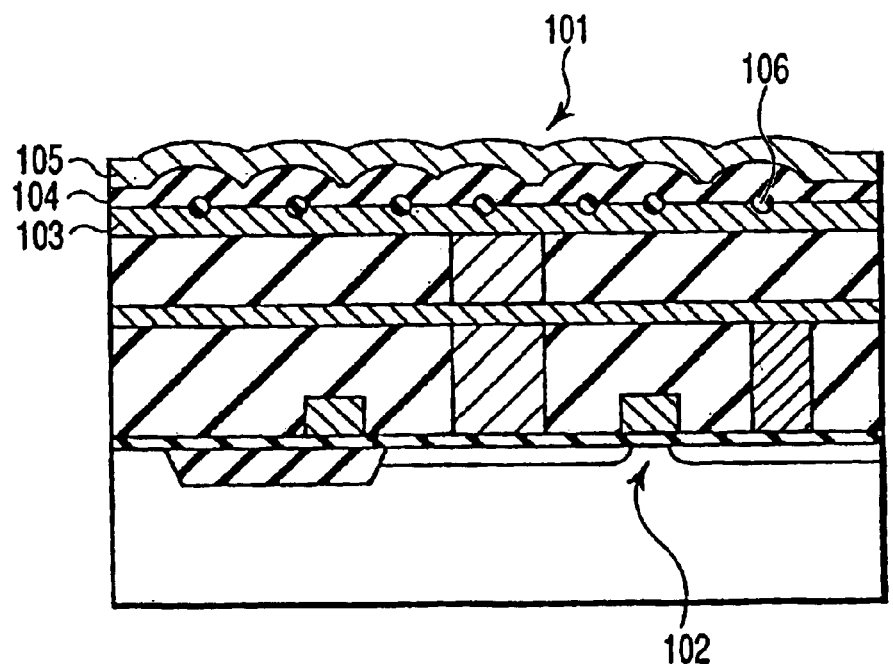
FIG. 19 is a schematic sectional view illustrating a conventional semiconductor memory device.
Figure 20:
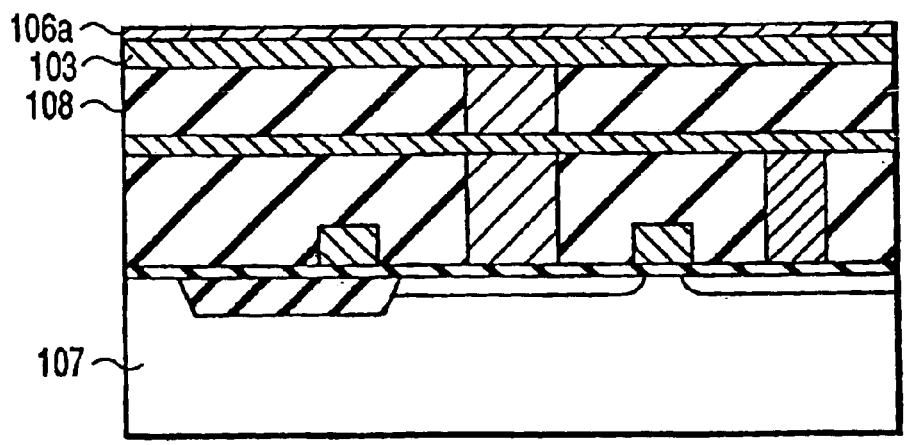
FIGS. 20, 21 and 22 are schematic sectional views illustrating a process for manufacturing the conventional semiconductor memory device of FIG. 19.
Figure 21:
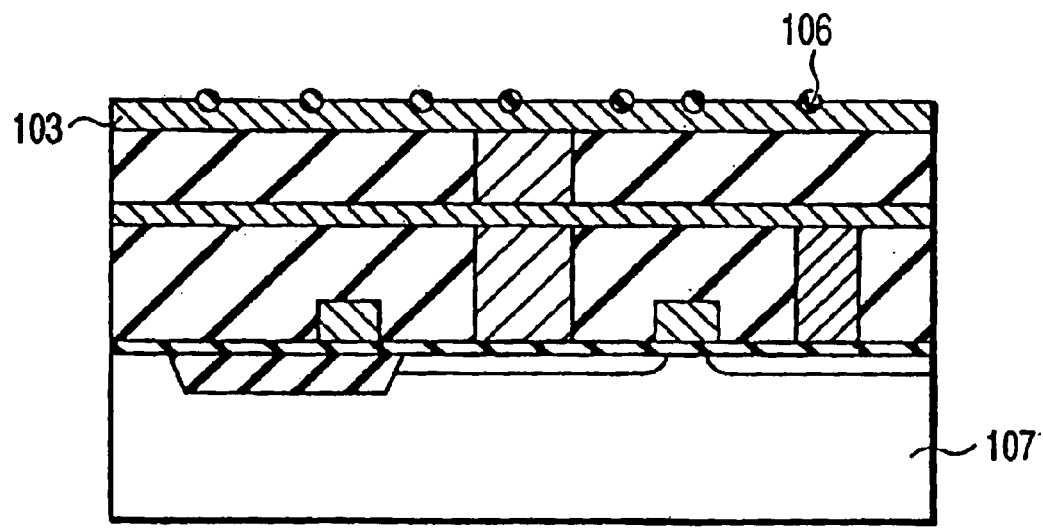
Figure 22:
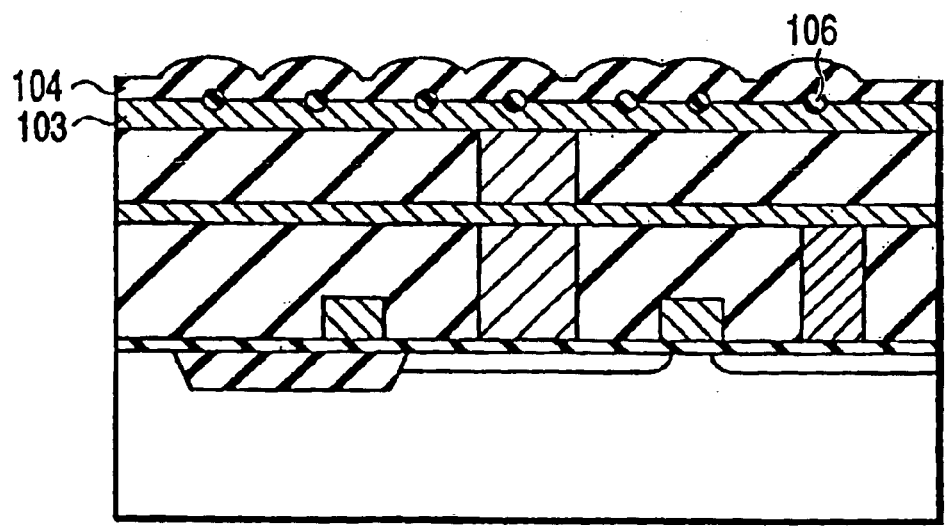

Referring to FIG. 18, the capacitor insulation film 52 is formed on the entire lower electrode 51 and on the silicon nitride film 44. The upper electrode 53 is formed on the entire capacitor insulation film 52. The formation of the capacitor insulation film 52 and upper electrode 53 is made by, for example, LPCVD.

The interlayer insulation film 54 is formed on the entire surface of the resultant semiconductor substrate 31 by, for example, LPCVD, as shown in FIG. 11. After that, wiring and contact plug (which are not shown), etc. are formed in the interlayer insulation film 54 by a known method.

The third embodiment can provide the same advantage as the first embodiment. Furthermore, in the third embodiment in which the invention is applied to a double-sided-cylinder-type stacked capacitor, the resultant capacitor can have a larger capacitance within a limited area than that obtained in the first or second embodiment.

The first to third embodiments are also applicable to the case where the capacitor electrodes are formed of polysilicon. In this case, to roughen the surface of the capacitor electrodes, no delicate temperature control is necessary unlike the prior art, therefore the roughening can be easily performed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device having a capacitor structure, comprising:

a semiconductor substrate;

a support layer provided above the semiconductor substrate;

a plurality of particles formed on the support layer;

a first electrode provided on the support layer and covering the particles, the first electrode having a first interface opposite to the particles, the first interface being wavy in accordance with a pattern of the particles;

a capacitor insulation film provided on the first interface, the capacitor insulation film having a second interface located opposite to the first interface, the second interface being wavy in accordance with a shape of the first interface; and a second electrode provided on the capacitor insulation film.

2. The semiconductor memory device according to claim 1, further comprising:

a gate electrode provided on the semiconductor substrate with a gate insulation film interposed therebetween;

a source diffusion layer and a drain diffusion layer provided in a surface portion of the semiconductor substrate to sandwich the gate electrode; and a conductive layer provided in the support layer and electrically connecting the first electrode to one of the source diffusion layer and the drain diffusion layer.

3. The semiconductor memory device according to claim 1, wherein the support layer is an interlayer insulation film.

4. The semiconductor memory device according to claim 1, wherein the support layer is a conductive layer provided in an interlayer insulation film which is provided above the semiconductor substrate.

5. The semiconductor memory device according to claim 1, wherein the particles are substantially formed of a material selected from the group consisting of silicon and silicon nitride.

6. The semiconductor memory device according to claim 5, wherein the semiconductor substrate has a major surface, the support layer has a trench, and a side wall defining the trench forms an angle to the major surface.

7. The semiconductor memory device according to claim 6, wherein the particles are provided on the side wall of the trench of the support layer.

8. The semiconductor memory device according to claim 1, wherein the semiconductor substrate has a major surface; the first electrode has a first portion located on the support layer and a second portion extending at an angle to the major surface; the first interface extending from the first portion to the second portion; the capacitor insulation film is provided on the first portion and the second portion; and the second electrode is provided on the capacitor insulation film which is provided on the first portion and the second portion.

9. The semiconductor memory device according to claim 8, wherein the second portion, part of the capacitor insulation film located on the second portion, and part of the second electrode located on the part of the capacitor insulation film on the second portion are cylindrical.

10. The semiconductor memory device according to claim 1, wherein the first electrode and second electrode are substantially formed of a material selected from the group consisting of a platinum group material and titanium nitride, and the capacitor insulation film is substantially formed of a high dielectric material.

11. The semiconductor memory device according to claim 1, wherein the first electrode has a thickness greater than a curvature radius of the particles.

12. The semiconductor memory device according to claim 1, wherein the second electrode has a third interface opposite to the second interface, the third interface being wavy in accordance with a shape of the second interface.

* * * * *

UNITED STATES PATENT AND TRADEMARK OFFICE
CERTIFICATE OF CORRECTION

PATENT NO. : 6,924,523 B2
DATED : August 2, 2005
INVENTOR(S) : Hideaki Aochi, Mitsuru Sato and Eiji Yoshida It is certified that error appears in the above-identified patent and that said Letters Patent is hereby corrected as shown below:

<u>Title page,</u>
Item [73], Assignee, add -- Fujitsu Limited, Kawasaki (JP) --.

Signed and Sealed this

Twenty-third Day of May, 2006

JON W. DUDAS
*Director of the United States Patent and Trademark Office*